United States Patent [19]
Boys

[11] 4,358,735
[45] Nov. 9, 1982

[54] BIDIRECTIONAL INCREMENTAL ENCODING SYSTEM FOR MEASURING MAXIMUM FORWARD ANGULAR DISPLACEMENT OF A BIDIRECTIONALLY ROTATABLE ROTATING SHAFT

[75] Inventor: John T. Boys, Birkenhead, New Zealand

[73] Assignee: SPS Technologies, Inc., Jenkintown, Pa.

[21] Appl. No.: 78,983

[22] Filed: Sep. 26, 1979

Related U.S. Application Data

[60] Division of Ser. No. 818,511, Jul. 25, 1977, Pat. No. 4,185,701, which is a continuation of Ser. No. 579,110, May 19, 1975, abandoned.

[51] Int. Cl.$^3$ .......................... G01B 7/14; G01P 3/48; G01P 3/54
[52] U.S. Cl. .................................. 324/208; 324/173; 340/672
[58] Field of Search ............... 324/165, 173, 174, 175, 324/208; 340/671, 672

[56] References Cited

U.S. PATENT DOCUMENTS 3,710,265  1/1973  Gray ................................. 324/165
3,938,112  2/1976  Gee ................................... 324/173

FOREIGN PATENT DOCUMENTS 762499  11/1956  United Kingdom ............... 340/672

Primary Examiner—Gerard R. Strecker
Assistant Examiner—Walter E. Snow
Attorney, Agent, or Firm—Aaron Nerenberg

[57] ABSTRACT

An impact wrench having an adaptive control system for determining the yield point or some similarly significant point of a fastener assembly by detecting a signal representative of the peak deceleration of the hammer, one embodiment of which is the peak recoil value of the hammer after impacting with the anvil of the wrench, and a signal representative of the angular displacement of the output shaft of the wrench. Yield of the fastener is determined when the respective magnitudes of successive deceleration signals do not exceed the magnitude of a previously stored maximum deceleration signal by a predetermined fixed amount. Upon attaining the yield point or other similarly significant point, the wrench may be allowed to rotate the fastener an additional preselected number of degrees before shutting off.

9 Claims, 6 Drawing Figures

BIDIRECTIONAL INCREMENTAL ENCODING SYSTEM FOR MEASURING MAXIMUM FORWARD ANGULAR DISPLACEMENT OF A BIDIRECTIONALLY ROTATABLE ROTATING SHAFT

This application is a divisional application of my copending application Ser. No. 818,511, filed on July 25, 1977, now U.S. Pat. No. 4,185,701, which application was a continuation of application Ser. No. 579,110, filed on May 19, 1975, now abandoned.

This invention relates generally to the field of tool driving or impacting, and more particularly to an impact type wrench having a control system for accurately controlling the tension in a fastener of a joint.

It is well known in the prior art that tightening a fastener to its yield point produces optimum joint efficiency. A fastened joint having a greater preload value up to the yield point of the material of the joint is more reliable and insures better fastener performance. High fastener preload further increases fatigue resistance due to the fastener feeling less added stress from external joint loading, and dynamically loaded joints have less tendency to slip and loosen.

The prior art reveals various types of impact wrench control systems for controlling the amount of preload in a fastener. One commonly used type employs some form of torque control, in which the impact wrench tightens a fastener to a maximum predetermined value of torque and thereupon shuts off. Examples of impact wrenches utilizing torque control can be found in U.S. Pat. Nos. to Schoeps et al., 3,835,934; Hall, 3,833,068; Schoeps, 3,703,933; Vaughn, 3,174,559; Elliott et al., 3,018,866 and Maurer, 2,543,979. Another means of controlling impact wrenches found in the prior art is commonly known as a "turn-of-the-nut" system, in which a fastener is tightened to some preselected initial condition, such as a predetermined torque value or spindle speed, and thereupon rotated an additional predetermined number of degrees before shutting off. Examples of various turn-of-the-nut impact wrench systems are found in U.S. Pat. Nos. to Allen, 3,623,557; Hoza et al., 3,318,390 and Spyradakis et al., 3,011,479. Another type of control comprises imparting a constant angular momentum of each impulse blow, such as found in the U.S. Pat. No. to Swanson, 3,181,672.

As can be seen from the numerous existing prior art systems, the problem is not a novel one. The ultimate desired result is to achieve preload of the fastener into the yield region. The common problem which each of the prior art systems attempts to solve is determining when the yield point of the fastener has been reached. In all of the control systems described in the above-noted patents, prior knowledge of the fastener and joint characteristics must be known or assumed in order to determine either the exact predetermined final torque, the exact amount of additional rotation or the amount of constant angular momentum of each impact blow. It is well known that tightening to a predetermined preload condition, such as the yield point, is a function of many variables, among them being joint stiffness, fastener stiffness, surface friction between mating threads and thread form. Therefore, in each of the prior art systems the yield point cannot always be accurately determined because the conditions of each fastener and joint vary and may not be known in advance. This consequence can lead to uneven tightening from joint to joint in a structure, which can in turn result in loosening of the fastener in the joint and premature fatigue failure.

It is known from the characteristics of fasteners that a yield phenomena occurs in the applied moment and the preload simultaneously, so that preload can be controlled by stopping the tightening process when the applied moment suggests that yield is occurring. Because of the nature of operation of certain types of wrenches, a continuous moment is not applied. For example, in an impact wrench a series of pulsed impacts of a hammer onto an anvil advances the fastener into a workpiece. During each impact, when the fastener has been tightened until it presents maximum resistance to further rotation, the anvil which is coupled thereto, also presents maximum resistance to further rotation and the peak torque or maximum moment applied by the hammer is reached. At this point, the hammer is subjected to its maximum deceleration which is proportional to its maximum applied moment, and experiences a recoil, the magnitude of which has been found to be proportional to the maximum deceleration of the hammer and thus of the maximum applied moment. In the present preferred embodiment of an impact wrench in accordance with this invention, the deceleration of the hammer in the form of its rotary motion is sensed by a recoil or bounce back mechanism. The magnitude of the recoil, either its duration, force, velocity or total distance of travel, give a measure of the deceleration of the hammer and, hence, the maximum applied moment. However, it has been found to be relatively easy to measure duration of recoil. Thus the recoil time and the angle of rotation can be monitored simultaneously, but a graph showing one as a function of the other is somewhat hypothetical as recoils only occur at the end of a blow while angular displacement occurs during a blow. By convention, therefore, the graphs are plotted as angular displacement at constant moment followed by a change of moment at constant angle.

SUMMARY OF THE INVENTION

Accordingly, it is a general purpose and object of the present invention to provide apparatus for tightening a fastener to the yield point or to some similarly significant point in a joint. It is another object of the invention to provide a control system for tightening a fastener to its yield point and which is particularly useful with a wrench that applies its tightening moment periodically. It is another object of the invention to provide an impact wrench having an adaptive control system for accurately tightening a fastener to a predetermined preload condition and which utilizes measured characteristics of the fastener and joint being tightened. It is still a further object of the invention to provide an adaptive control system in an impact wrench for accurately tightening a fastener to a predetermined preload with minimum prior knowledge of the fastener and joint characteristics. It is yet another object to provide an impact wrench having an adaptive control system which determines the yield point of the fastener by measuring the magnitude of deceleration of the hammer after engagement with the anvil, and issuing a stop control signal when no subsequent deceleration values exceed a previous peak deceleration value by a predetermined additional amount. It is still a further object to provide an impact wrench having an adaptive control system which measures the magnitude of recoil of the hammer after engagement with the anvil, measures the angular displacement of the output shaft, and issues a shutoff signal to the wrench after a predetermined additional number of degrees of rotation subsequent to measuring a peak recoil value which is not exceeded by subsequent recoil values by more than a fixed or variable additional amount.

These and other objects are accomplished according to a preferred embodiment of the present invention by providing a wrench such as an impact wrench having a control system including means for developing a signal representative of the deceleration of the hammer after engagement with the anvil which signal is also representative of the applied moment, means responsive to the deceleration signal for determining the yield point or some similarly significant point of a fastener assembly and means for producing a control output signal when the fastener assembly is tightened to the yield point or similarly significant point.

DESCRIPTION OF THE PREFERRED EMBODIMENT

Figure 5:
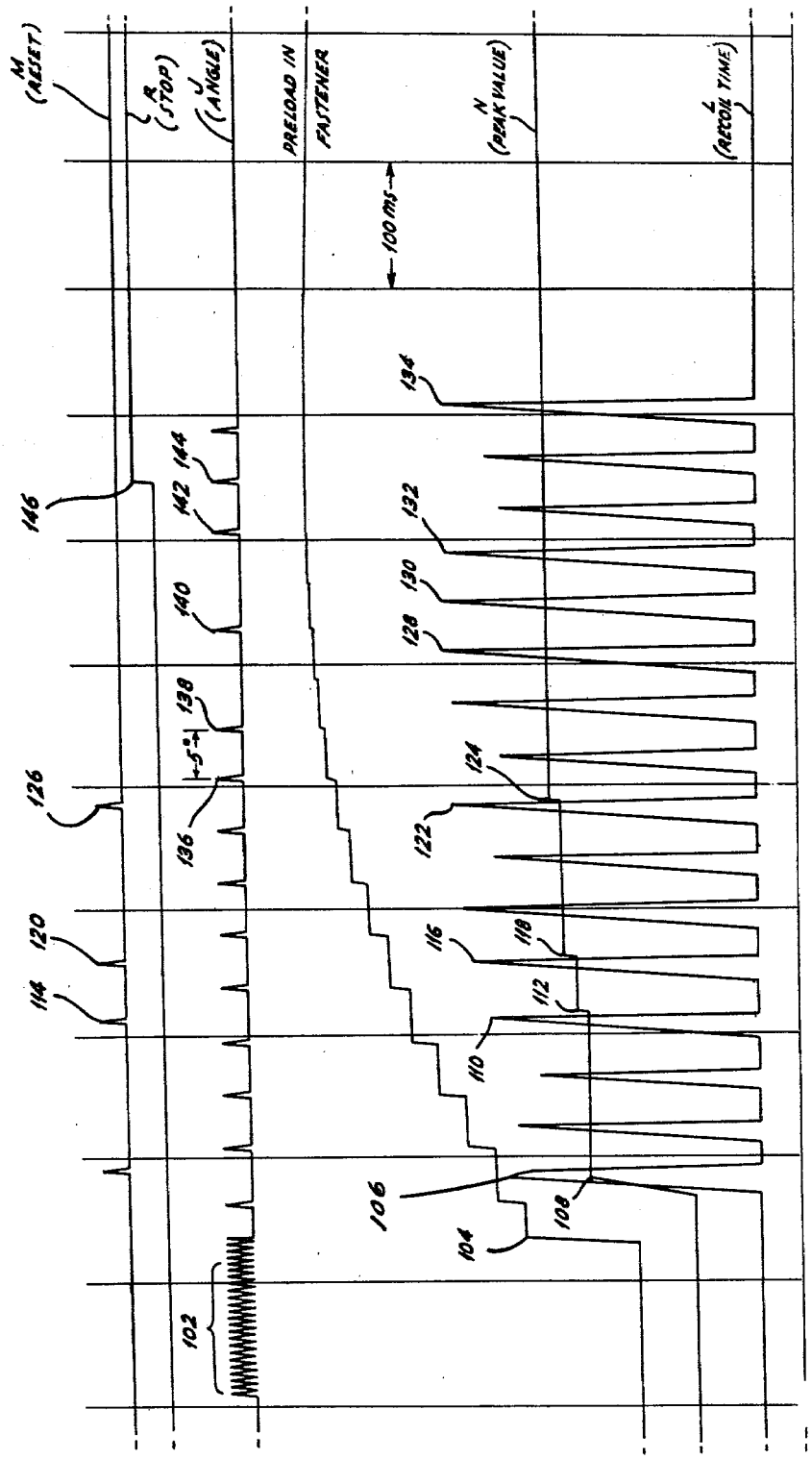
FIG. 5 is a graph showing the various parameters during the operation of the wrench.

Before proceeding with a description of an apparatus in accordance with this invention, a brief explanation of a method in accordance with this invention will be explained. Referring briefly to FIG. 5 of the drawing there is disclosed a curve (PRE-LOAD IN FASTENER) illustrating the relationship between the preload induced in a fastener tightened by a periodically or cyclically operated tool such as an impact wrench and elapsed time during the tightening cycle. From the noted curve it can be seen that initially the preload increases rapidly and eventually levels off so that only small additional preload is induced in the fastener. This leveling off occurs at about the yield point and continues through the remainder of the tightening cycle. Similar phenomena are observable in the relationship between applied moment and time as illustrated in curve L (RECOIL TIME) and curve N (PEAK VALUE). It is merely noted here that recoil time is representative of the applied moment.

In accordance with this invention a fastener is tightened to its yield point by applying a tightening moment to the fastener and periodically measuring the applied moment. Preferably the moment is applied periodically and the peak moment applied during each period is determined. By "peak moment" is meant the largest moment applied during each period. The instantaneous peak moment is compared with the largest peak moment which has been applied previously during the tightening cycle to determine if the instantaneous peak moment exceeds the previous largest peak moment by more than a predetermined amount. The predetermined amount may vary slightly for fasteners of different types but it has been determined that the predetermined amount is normally about 2% of the previous largest peak moment in which case the predetermined amount is variable. It has also been determined that the 2% can be approximated and an absolute value can be used, for example, 2% of the peak moment expected to be applied at the yield point.

If the instantaneous peak moment exceeds the previous largest peak moment by the predetermined amount, the application of the tightening moment continues and the instantaneous peak moment is stored for comparison with the next instantaneous peak moment; if the instantaneous peak moment does not exceed the previous largest peak moment by more than the predetermined amount the application of the tightening moment can be discontinued since this indicates that the fastener has been tightened to its yield point as should be understood from the explanation of the relationships between preload and time and between moment and time.

Referring briefly to curve L (RECOIL TIME) in FIG. 5 of the drawing it can be seen that during some periods before the fastener has been tightened to its yield point the instantaneous peak moment is less than the largest previous peak moment. These occurrences are random in the sense that they are not predictable and it is possible that the application of the tightening moment could be discontinued before the yield point is reached. Accordingly, it is desirable to not discontinue the application of the tightening moment until the instantaneous peak amount has not exceeded the previous largest peak moment by the predetermined amount for a predetermined number of successive periods during which the moment is applied. While two such detections are sufficient, three to five is preferable. It has been found most preferable to measure a second tightening characteristic related to the period during which the moment is applied, for example, to measure angular rotation of the fastener during the tightening cycle, and to not discontinue the application of the tightening moment until the instantaneous peak moment has not exceeded the previous largest peak moment by the predetermined amount during a predetermined rotation of the fastener, for example, during 15 to 25 degress. In this way, it can be assured that the applied moment is operative to cause rotation of the fastener even though the torque is levelling off. It should be understood that other characteristics could be measured instead of rotation so long as these other characteristics are related to the moment in the same general way as rotation. That is, any characteristic related to the moment such that the moment levels off with respect to that characteristic can be used in place of rotation. Time, for example, can be used.

The described method could be performed by hand, but an apparatus performing the method will be described. While any type of wrench system applying torque periodically can operate to perform the method, the preferred embodiment disclosed herein is an impact wrench.

Figure 1:
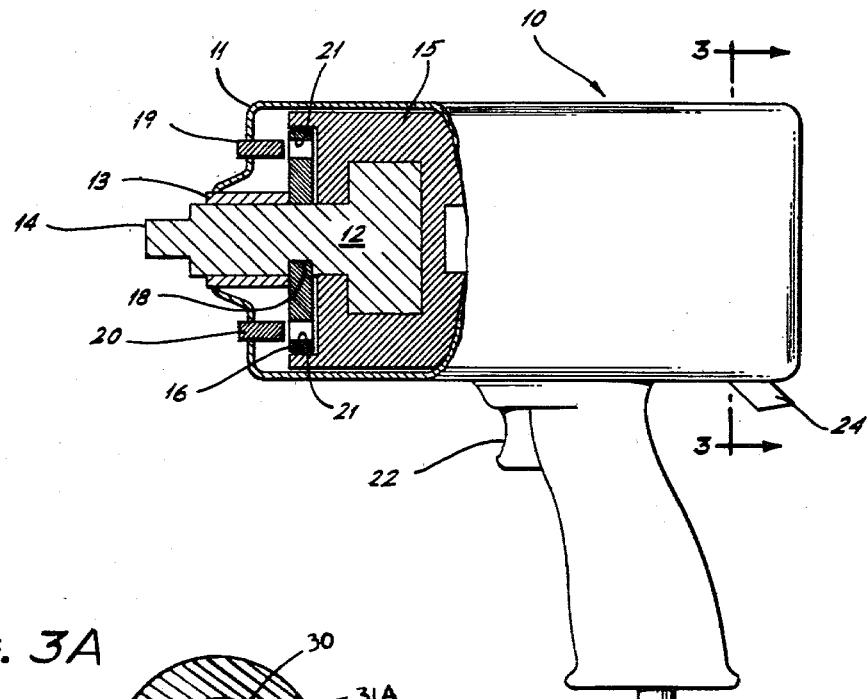
FIG. 1 is a side elevational view of an impact wrench constructed according to the invention partially cut away and in cross-section, showing an angle encoder and sensing means.
Figure 3A:
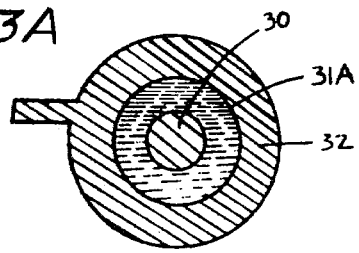
FIG. 3A is a partial transverse sectional view schematically illustrating another embodiment of a recoil detection apparatus usable with this invention.
Figure 2:
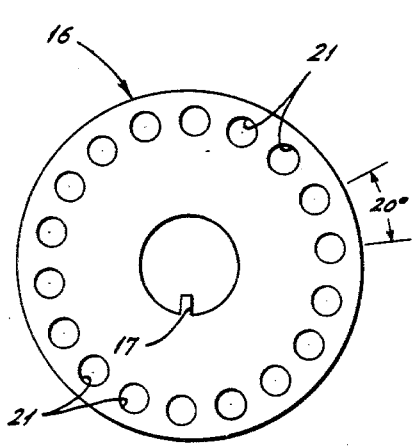
FIG. 2 is a front elevation view of the angle encoder shown in FIG. 1.
Figure 3:
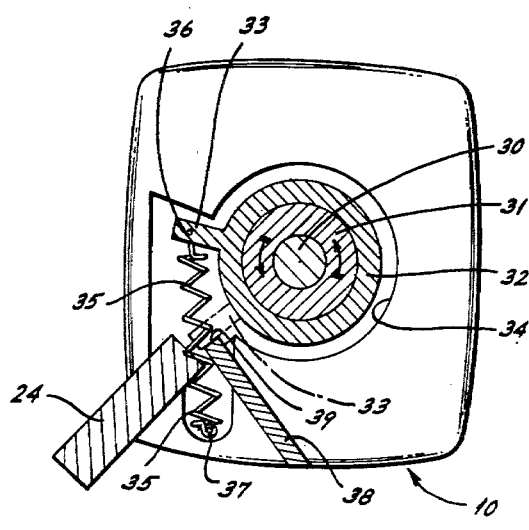
FIG. 3 is a transverse sectional view taken along the line 3—3 of FIG. 1 looking in the direction of the arrows, showing the recoil detection apparatus.

Referring to FIGS. 1, 2 and 3, an impact wrench 10 is shown, which may be any one of many conventional types that include an external source of compressed air suitably connected to the wrench in order to successively impact a hammer onto an anvil. An anvil 12 is rotatably secured within the forward portion of the wrench housing 11 by a bearing 13. The forward end 14 of anvil 12 comprises, for example, a square drive for attachment to a drive socket or some other suitably shaped wrenching member for driving a fastener. A hammer assembly 15 connected to and driven by a conventional air motor (not shown) surrounds and contacts anvil 12 imparting impact blows thereto to rotate the anvil and drive a fastener (not shown). Wrench 10 also includes a conventional trigger 22 which, when depressed, allows air from the external source (not shown) to enter wrench 10 at an inlet port 23 connected to an air motor (not shown) driving hammer 15 to rotate anvil 12.

A bidirectional incremental encoder 16 used in a system for measuring angular rotation of the fastener is suitably fixed to anvil 12 for rotation therewith within the forward portion of wrench housing 11, such as, for example, by key 17 mating with a corresponding recess 18 in anvil 12. Since the anvil 12 drives the wrenching member driving the fastener, the encoder 16 rotates with the fastener as the fastener is tightened. Between impacts of the hammer 15 against the anvil 12, the anvil and encoder 16 recoil, but the fastener does not. Thus the rotation measuring system in which the encoder 16 is used should be capable of detecting and disregarding the recoil of the encoder. Holes 21 are each located at a fixed radius on encoder 16. A pair of sensors 19 and 20 are suitably mounted in the forward end of housing 11, each at a fixed radius from the center line of anvil 12 so that they line up radially with holes 21. Sensors 19 and 20 are preferably of a magnetic type, that is, could include an induction coil whose output varies due to the presence or absence of metal, but any other suitable proximity type sensor may be used to detect the passage of successive ones of holes 21 during operation of the wrench. As can be seen in FIG. 2, encoder 16 in the preferred embodiment contains eighteen (18) equally spaced holes, the center lines of each hole being twenty (20°) degrees apart at a fixed radius from the center line of the encoder. As will be explained later the output signals of the sensors 19 and 20 are ninety (90°) degrees out of phase so the sensors are spaced apart to provide that result. Thus, the sensors 19 and 20 could be spaced apart a distance equal to the sum of five (5°) degrees plus some whole number multiplied by twenty (20°) degrees, for example twenty-five (25°), forty-five (45°), sixty-five (65°), etc. degrees. Resolution with this encoder is 72 counts per revolution as will also be explained later. It should be understood that the encoder could contain any reasonable number of holes depending on the degree of accuracy desired, the only requirement being that the holes are spaced equally apart from each other. A proximity type sensor 24, which also can include an induction coil similar to sensors 19 and 20, is mounted at the bottom rear portion of the wrench housing for measuring deceleration in the form of recoil or bounce back of the hammer. As noted previously the deceleration of the hammer is proportional to the peak moment applied during each impact.

Referring now to FIG. 3, the bounce back or recoil indicating mechanism is shown. An output shaft 30 from the air motor (not shown) is connected through a conventional one-way clutch 31, to a rotatable cannister 32 having an arm 33 extending from the surface thereof. The arrows on clutch 31 indicate that the normal direction of rotation of shaft 30 is clockwise when viewed in a direction opposite the arrows on line 3—3. Clutch 31 transmits rotational force to cannister 32 when hammer 15, which is suitably connected to rotate shaft 30, rebounds off of anvil 12 in the counter-clockwise direction when viewed in a direction opposite the arrows on line 3—3 after imparting a blow thereto. Cannister 32 is located inside of cutout 34 at the rear portion of wrench housing 11. A spring 35 is attached at one of its ends in some suitable manner at a point 36 adjacent the distal end of arm 33, and at its other end at a point 37 adjacent the bottom of wrench 10. Spring 35 is typically an elongated coil spring, but may be any other suitable elastic tensioning device for exerting a downward force on arm 33. An end stop 38 is mounted at the bottom of wrench 10 and extends upwardly at an angle with its distal end 39 proximate the sensing end of sensor 24.

Operation of the bounce back or recoil detection apparatus will now be described. On each successive impact of the hammer onto the anvil, as the fastener is rotated the energy stored in the hammer and anvil drops to a point where resistance to further rotation caused by tightening of the fastener in the workpiece begins to occur. Upon further tightening, a deceleration of the hammer at the end of a blow in the form of a recoil occurs, the duration, total displacement, velocity and force of the recoil being proportional to the applied moment. The force of the recoil is transmitted through shaft 30 and clutch 31 to cannister 32, which is initially in a position indicated by the dotted lines in FIG. 3 with arm 33 resting on distal end 39 of end stop 38. The force of the recoil causes shaft 30 and cannister 32, coupled together by clutch 31, to rotate in a counter-clockwise direction looking forward (clockwise as seen in FIG. 3), causing arm 33 to move upwardly off of end 39 of stop 38 against the restoring force of spring 35. This restoring force causes arm 33 to return to its initial position resting on distal end 39 of stop 38 after some finite duration of time which is proportional to the recoil energy, and thus the deceleration of hammer 15. Sensor 24 measures the duration of time it takes arm 33 to complete its cycle. The duration of time is, as mentioned hereinabove, dependent upon the amount of recoil energy transmitted from hammer 15 to shaft 30, the maximum amount of recoil energy occurring at approximately the maximum preload in the fastener, at or near the fastener yield point. It should be understood that either the distance travelled or velocity of arm 33 travel, or force exerted by spring 36 on pin 37 could also be measured, as they are all proportional to hammer deceleration and thus the applied moment. Other parameters proportional to the applied moment can also be measured, for example, the rotation of the fastener.

In another embodiment of the recoil detection apparatus shown in FIG. 3, clutch 31 could be replaced by a viscous Newtonian fluid 31A suitably contained between shaft 30 and cannister 32 as shown in FIG. 3A. Viscous drag force of the fluid would then transmit the recoil force of the hammer which is coupled to shaft 30, to cannister 32 in the same manner as clutch 31 illustrated in FIG. 3. For a more complete description of a one-way fluid clutch, reference is made to U.S. Pat. No. 2,521,117, issued to G. B. DuBois et al. Measurement of the total duration of the recoil would be exactly as described above.

Figure 4:
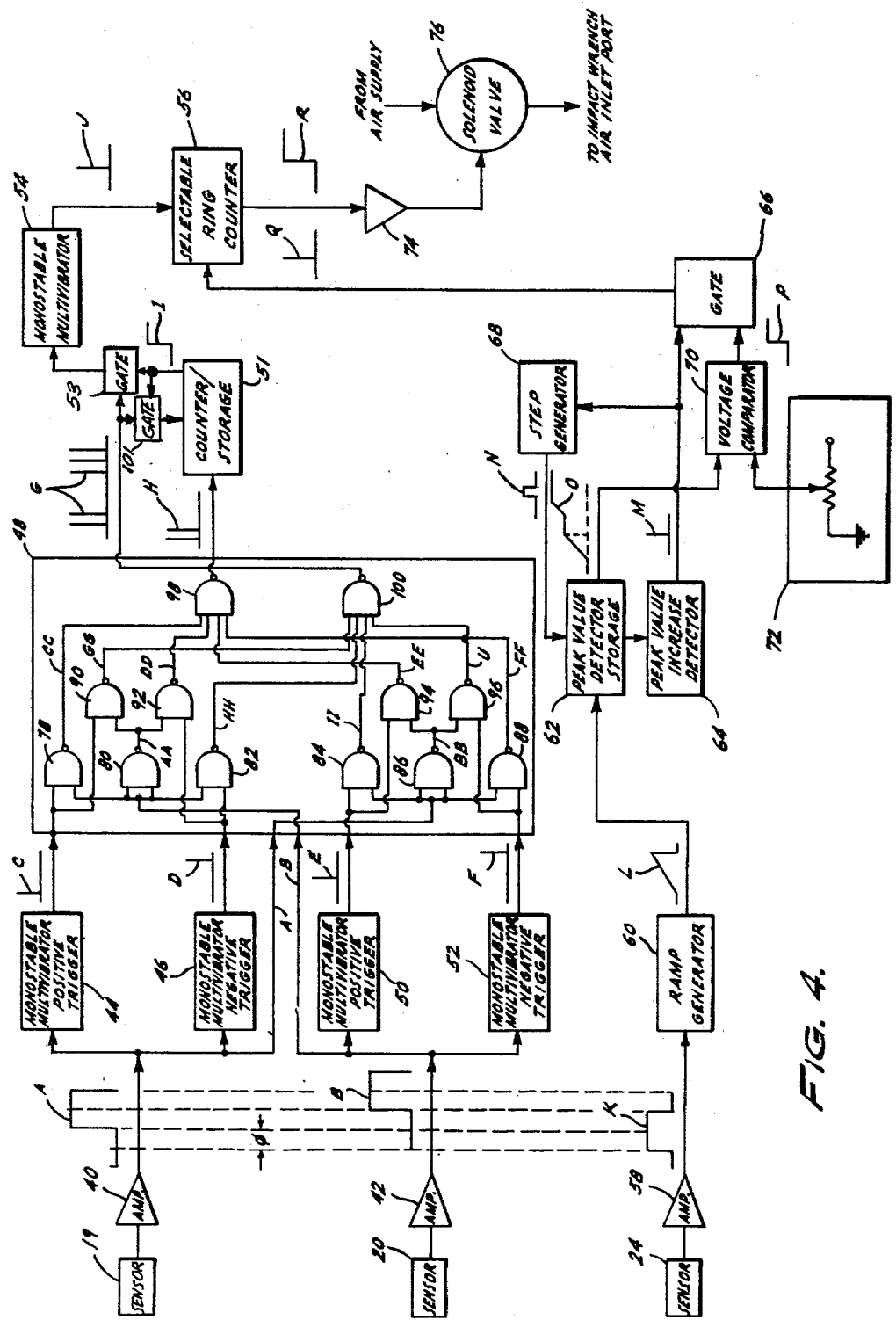
FIG. 4 is a block diagram of the control circuit of the impact wrench of FIG. 1.

Referring to FIG. 4, a control system is shown for controlling the tightening cycle of wrench 10. The coils of sensors 19 and 20 are supplied with a suitable voltage and as the encoder 16 rotates, the sensors outputs vary depending on whether a hole 21 or the metal between holes is adjacent their ends. For example, the sensors 19 and 20 can be arranged to provide a high output when metal is detected and a low output when it is not. The output signal from sensor 19 is fed into an amplifier 40, and the output signal from sensor 20 is similarly fed into an amplifier 42, in order to amplify the respective angle signals to a magnitude at which they are compatible with the rest of the control system. Signal A from amplifier 40 is characteristically 90° out of phase ($\phi$) with signal B from amplifier 42, the signals having a characteristic square wave shape the pulse width of which are proportional to the radian spacing between holes 21. The square wave shape of signals A and B can be assured by using Schmitt triggers in the amplifier circuits. Output signal A from amplifier 40 is fed concurrently into a first monostable multivibrator 44 having a positive trigger, a second monostable multivibrator 46 having a negative trigger, and pulse sorting logic 48 which separates pulses produced by forward and reverse recoil rotations of angle encoder 16. Logic 48 will be described in greater detail hereinbelow. Output signal B from amplifier 42 is fed concurrently into a first monostable multivibrator 50 having a positive trigger, a second monostable multivibrator 52 having a negative trigger and pulse sorting logic 48. Output signal C from multivibrator 44 is characteristically a sharp pulse corresponding to the positive going portion of signal A, and output signal D from multivibrator 46 is a pulse corresponding to the negative going portion of signal A. Similarly, output signal E from multivibrator 50 is a pulse corresponding to the positive going portion of signal B, and output signal F from multivibrator 52 is a pulse corresponding to the negative going portion of signal B. Signals C, D, E and F are each introduced into pulse sorting logic 48 along with signals A and B. The pulses produced by forward and reverse rotations of angle encoder 16 are separated in logic 48, which yields output signals G, each representing an increment of forward rotation of the encoder 16, and H, each representing an increment of reverse rotation of the encoder 16. Signals G and H are fed into a counter/storage unit 51 which counts the number of forward and reverse rotation pulses and stores this information. Unit 51 may typically comprise a synchronous 8-bit up/down binary counter which includes two 4-bit binary counters in cascade. Counter/storage unit 51 acts as an inhibitor of forward rotation pulses G through a NAND gate 53 and is arranged to count up forward rotation pulses G and count down reverse rotation pulses H. Counter/storage unit 51 is further arranged so that it provides a low input signal to NAND gate 53 when it is set to zero or is counting up from zero and so that it provides a high input signal to the NAND gate when it is counting down from zero or counting up to zero. These inputs to NAND gate 53 are preferably provided by placing a signal inverter between the output of counter/storage unit 51 and NAND gate 53 and by having the counter/storage unit output a high signal when it is set at zero or counting up from zero and output a low signal when it is counting down or counting up to zero. The signal inverter, as is conventional, inverts the output of counter/storage unit 51 before it is fed to NAND gate 53. Thus, signals G cause NAND gate 53 to discharge only when unit 51 is set at zero or is counting up from zero.

In addition a second NAND gate 101 can be placed between the output of NAND gate 100 and the input of signal G to counter/storage unit 51 so that signals G are fed to unit 51 through this second NAND gate 101. For its other input the second NAND gate 101 receives the output signal from counter/storage unit 51 before that signal is inverted.

Operation of this preferred arrangement will now be explained. When tightening of the fastener commences, forward rotation pulses G are discharged by NAND gate 100 and provide inputs to the second NAND gate 101 and NAND gate 53. The output from counter/storage unit 51 is high since the unit is set at zero and this high signal is received as the second input to the second NAND gate 101. Thus pulses G are not fed to counter/storage unit 51 so it remains set at zero. The output from counter/storage unit 51 is inverted by the inverter so that the second input to NAND gate 53 is low. Thus, pulses G cause NAND gate 53 to output a high signal to monostable multivibrator 54 causing it to output a signal.

If encoder 16 recoils between an impact of hammer 15 against anvil 12, NAND gate 100 does not output signal G and NAND gate 98 outputs signals H which are fed to counter/storage unit 51 and counted down. The output of unit 51 is now a low signal which is fed to the second NAND gate 101 and which is inverted and fed to NAND gate 53 as a high signal. When forward rotation pulses G are provided by NAND gate 100 indicating forward rotation, the second NAND gate 101 discharges to counter/storage unit 51 and are counted up. At the same time the pulses G cannot feed past NAND gate 53 because of the high input signal from the inverter. When the forward rotation pulses G equal the reverse rotation pulses H counter/storage unit 51 counts zero and its output goes high. As noted previously, when unit 51 outputs a high signal, signals G are not counted up and are fed through NAND gate 53 to monostable multivibrator 54. From the preceding it should be understood that recoil pulses are made up and signal I is representative of an increment of fastener rotation. Signal I is characteristically a single step function. The output from gate 53 is fed into a monostable multibibrator 54 whose output signal J is fed into a selectable ring counter 56, which produces an output signal R after a predetermined number of forward rotation pulses between 1 and 10 has been received, as will be more fully explained hereinafter. Counter 56 may also be referred to as a divide-by-10 counter/divider with ten decoded outputs, and is typically a pair of 5-bit shift registers connected serially. Output signal J from multivibrator 54 is thus a pulse representing an increment of net forward angular rotation of encoder 16.

The output signal from sensor 24 is fed into an amplifier 58 which yields an output signal K representative of the magnitude of the total time for arm 33 (FIG. 3) to move off of, and return to rest upon end 39 to stop 38. It should be understood that force, velocity or distance or recoil could also be used with equally successful results as they are each similarly proportional to the applied moment. Since the rotation of the fastener is proportional to the applied moment, another technique for developing a signal representative of the applied moment of each impact would be to measure the rotation of the fastener during each impact. The coil of sensor 24 is supplied with a suitable voltage and its output varies depending on whether arm 33 is seated on the end 39 of stop 38. For example, sensor 24 and amplifier 58 can be arranged to provide a high output when no metal is detected and a low output when metal is detected. Signal K, which is a square wave whose width is proportional to total recoil time, is fed into a ramp generator 60 which produces a characteristic ramp function output signal L whose amplitude is proportional to the duration of signal K. Signal L is then fed into a peak value detector and storage unit 62 which stores the maximum or peak value of recoil time from sensor 24. Peak value detector and storage unit 62 is generally conventional and includes an amplifier (not shown) for detecting whether an instantaneous signal L has increased and a storage unit (not shown) for storing the largest signal L plus a predetermined increment as will be explained. The storage unit can be in the form of a capacitor arrangement. The amplifier receives input signal L from ramp generator 62 and also the signal stored in the storage unit so that it can determine whether the instantaneous signal L is larger than the stored signal. If it is not the amplifier provides no output; if it is the amplifier outputs the larger signal to the storage unit and provides another output to a peak value increase detector 64, which is typically a monostable multivibrator, producing an output pulse M. Output signal M from detector 64 is characteristically a sharp pulse and is fed simultaneously into an exclusive NOR gate 66 and a step generator 68 which outputs a signal N which increases the instantaneous signal L stored in the storage unit of peak value detector and storage unit 62 by a fixed or variable amount for each input pulse M received. Output signal N from step generator 68 is a square wave or short duration and fixed amplitude. As will be more fully explained in the description of the operation of the control system, a fixed value of voltage may be added (100 mv, for example), or a fixed percentage of the maximum stored peak recoil value may be added (2%, for example). The increased peak recoil value output signal from the storage unit is fed back into the amplifier for comparison with incoming signal L. The stored peak value of peak value detector and storage unit 62 is also fed as an output signal O, indicative of the increased peak value, into a voltage comparator 70, which is typically an operational amplifier, receiving a second input signal from a snug torque setting unit 72. Signal O has a characteristic stepped ramp function profile. Unit 72 may be any suitable variable voltage producing device, such as a potentiometer, in which a voltage proportional to some determinable snug torque is generated. By snug torque is meant the torque at which the fastener has pulled the joint parts together and wherein preload is being induced. The voltage levels from detector and storage unit 62 and setting unit 72 are compared in comparator 70, and when the first is at least equal to the second, an output signal P from comparator 70, is fed into NOR gate 66 which also receives as a second input the signal M from detector 64. Signal P has a characteristic single step function shape. As is conventional, NOR gate 66 will provide a high output signal Q only when it has two low input signals or two high input signals. Thus, before the fastener has been tightened to its snug torque and with no increased peak value signal from the storage unit in unit 62, that is, with both inputs low, NOR gate 66 outputs signal Q which resets counter 56 to zero. When the snug torque is reached, signal P is fed from comparator 70 so that the NOR gate does not output signal Q and counter 56 can now count. If, after the snug torque is reached, a signal L exceeds the previous maximum signal L by the predetermined amount added by signal N, monostable multivibrator 64 outputs signal M to NOR gate 66 so that signal Q is again fed to counter 56 resetting the counter to zero. Thus, if the instantaneous peak applied moment does not exceed the previous maximum peak applied moment by the predetermined amount over an interval of rotation equal to a predetermined number of counts multiplied by the predetermined increment of rotation sensed by the encoder, then counter 56 will output a signal R which is a single step function amplified in amplifier 74 and fed to the coil of a conventional solenoid valve 76 for shifting the spindle of the valve to its closed position. Solenoid valve 76 is placed in the air supply line to the impact wrench so that when the spindle is shifted to its closed position, the air supply to port 23 of wrench 10 is closed.

Still referring to FIG. 4, pulse sorting logic 48 will be described in greater detail. Logic 48 includes a plurality of NAND gates 78, 80, 82, 84, 86, 88, 90, 92, 94 and 96, each having two inputs and a single output, and 4-input NAND gates 98 and 100, each having four inputs and a single output. Gate 78 receives a signal C at a first input terminal and signal B at a second input terminal. Gate 80 receives signal B at both input terminals. Gate 82 receives signal B at a first input terminal and signal D at a second input terminal. Gate 84 receives signal E at a first input terminal and signal A at a second input terminal. Gate 86 receives signal A at both input terminals. Gate 88 receives signal F at a first input terminal and signal A at a second input terminal. Gate 90 receives signal C at a first input terminal and a signal AA, representing the output signal from gate 80, at a second input terminal. Gate 92 receives signal D at a first input terminal and signal AA from gate 80 at a second input terminal. Gate 94 receives signal E at a first input terminal and a signal BB, representing the output from gate 86, at a second input terminal. Gate 96 receives signal F at a first input terminal and signal BB from gate 86 at a second input terminal. Gate 98 receives a signal CC, representing the output from gate 78, at a first input terminal, a signal DD, representing the output from gate 92, at a second input terminal, signal EE, representing the output from gate 94, at a third input terminal, and signal FF, representing the output from gate 88, at a fourth input terminal. Output signal H from gate 98 is representative of the reverse rotation pulses only of encoder 16. Gate 100 receives an input signal GG, representing the output from gate 90, at a first input terminal, a signal HH, representing the output from gate 82, at a second input terminal, a signal II representing the output from gate 84, at a third input terminal, and a signal JJ, representing the output from gate 96, at a fourth input terminal. Output signal G from gate 100 is representative of the forward rotation pulses only of encoder 16.

As should be clear from the preceding description, in the circuit comprising the pulse sorting logic 48, each transition from high to low or from low to high of each signal A and B is operative to cause either of the NAND gates 98 or 100 to provide a signal indicating the encoder 16 has experienced a predetermined increment of rotation. Since two transitions occur in each of the two sensor outputs, each hole 21 causes four transitions per revolution. Since there are eighteen (18) holes in the encoder 16, the encoder has a resolution of seventy-two counts per turn (four multiplied by eighteen) which in turn means that each signal G and H represents five (5) degrees of rotation (360÷72). For each five (5) degrees of forward rotation of the encoder, NAND gate 100 outputs the pulse G and for each five (5) degrees of reverse rotation or recoil of the encoder, NAND gate 98 outputs the pulse H.

Operation of the pulse sorting logic should be clear from the preceding description, but will be explained briefly. Assume that encoder 16 is rotating in the forward direction, that is, that the fastener is being tightened by the impact of hammer 15 on anvil 12. Assume further that signal A is experiencing a low to high transition and signal B, ninety degrees out of phase, is low. Under these conditions, pulse C is produced by monostable multivibrator 44, and monostable multivibrators 46, 50 and 52 have no output. NAND gate 78 receives high input pulse C and signal B which is at its low level so output signal CC is high; NAND gate 80 receives the low input signals B so output signal AA is high; NAND gate 82 receives a low input signal B and low input signal D so output signal HH is high; NAND gate 84 receives the low input signal E and high input signal A so output signal II is high; NAND gate 86 receives the high input signals A so output signal BB is low; and NAND gate 88 receives high input signal A and low input signal F so output signal FF is high. NAND gate 90 receives high input pulse C and high input signal AA so output signal GG is low; NAND gate 92 receives high input signal AA and low input signal D so output signal DD is high; NAND gate 94 receives low input signal E and low input signal BB so output signal EE is high; and NAND gate 96 receives low input signal BB and low input signal F so that output signal U is high. NAND gate 98 receives high signal CC, high signal DD, high signal EE and high signal FF so there is a low output signal. NAND gate 100 receives low signal GG, high signal HH, high signal II and high signal U so there is provided a pulse G representative of an increment of forward rotation.

At the instant signal B experiences a low to high if encoder 16 is rotating forward, signal A is still high so that monostable multivibrator 50 provides output pulse E while the output of monostable multivibrators 44, 46 and 52 remain low. Working the logic through the various NAND gates it can be seen that NAND gate 98 receives high input signal CC, high input signal DD, high input signal EE and high input signal FF so there is a low output signal. NAND gate 100 receives high input signal GG, high input signal HH, low input signal II and high input signal U so output pulse G is provided.

At the instant signal A experiences high to low transitions, if encoder 16 is still rotating forward, signal B is still high so that monostable multivibrator 46 provides output pulse D while the output of monostable multivibrators 44, 50 and 52 remain low. working the logic through the various NAND gates it can be seen that NAND gate 98 receives high input signal CC, high input signal DD, high input signal EE and high input signal FF so there is a low output signal. NAND gate 100 receives high input signal GG, low input signal HH, high input signal II and high input signal U so output pulse G is provided.

At the instant signal B experiences a high to low transition, if encoder 16 is still rotating forward, signal A is low so that monostable multivibrator 52 provides output pulse F while the output of monostable multivibrators 44, 46 and 50 remains low. Working the logic through the various NAND gates it can be seen that NAND gate 98 receives high input signal CC, high input signal DD, high input signal EE and high input signal FF so there is a low output signal. NAND gate 100 receives high input signal GG, high input signal HH, high input signal II and low input signal U so output pulse G is provided.

Assume now that encoder 16 is rotating in the reverse direction, that is, that the encoder is recoiling between impacts of hammer 15 on anvil 12. Assume further that signal B is experiencing a low to high transition and signal A, ninety degrees out of phase is low. Under these conditions, pulse E is produced by monostable multivibrator 50 and monostable multivibrators 44, 46 and 52 have no output. NAND gate 78 receives low input signal C and signal B which is high so output signal CC is high; NAND gate 80 receives the high input signals B so output signal AA is low; NAND gate 82 receives high input signal B and low input signal D so output signal HH is high; NAND gate 84 receives the high input pulse E and low input signal A so output signal II is high; NAND gate 86 receives the low input signals A so output signal BB is high; and NAND gate 88 receives low input signal A and low input signal F so output signal FF is high. NAND gate 90 receives low input signal C and low input signal AA so output signal GG is high; NAND gate 92 receives low input signal AA and low input signal D so that output signal D is high; NAND gate 94 receives the high input pulse E and high input signal BB so output signal EE is low; and NAND gate 96 receives high input signal BB and low input signal F so output signal U is high. NAND gate 98 receives high input signal CC, high input signal DD, low input signal EE and high input signal DD so there is provided a pulse H representative of an increment of reverse rotation. NAND gate 100 receives high input signal GG, high input signal HH, high input signal II and high input signal U so there is a low output signal.

At the instant signal A experiences a low to high transition, if encoder 16 is rotating in the reverse direction, signal B is still high so that monostable multivibrator 44 provides output pulse C while the output of monostable multivibrators 46, 50 and 52 remain low. Working the logic through the various NAND gates it can be seen that NAND gate 98 receives low input signal CC, high input signal DD, high input signal EE, high input signal FF so output pulse H is provided. NAND gate 100 receives high input signal GG, high input signal HH, high input signal II and high input signal U so there is a low output signal.

At the instant signal B experiences a high to low transition, if encoder 16 is still rotating in the reverse direction, signal A is still high so that monostable multivibrator 52 provides output pulse F while the output of monostable multivibrators 44, 46 and 50 remain low. Working the logic through the various NAND gates it can be seen that NAND gate 98 receives high input signal CC, high input signal DD, high input signal EE and low input signal FF so output pulse H is provided. NAND gate 100 receives high input signal GG, high input signal HH, high input signal II and high input signal U so there is a low output signal.

At the instant signal A experiences a high to low transition, if encoder 16 is still rotating in the reverse direction, signal B is still low so that monostable multivibrator 46 provides output pulse D while the output monostable multivibrators 44, 50 and 52 remains low. Working the logic through the various NAND gates it can be seen that NAND gate 98 receives high input signal CC, low input signal DD, high input signal EE and high input signal FF so output pulse H is provided. NAND gate 100 receives high input signal GG, high input signal HH, high input signal II and high input signal U so there is a low output signal.

Operation of the control system will now be described with reference to all of the figures and particularly with reference to FIGS. 4 and 5. As the impact wrench begins to tighten a fastener, sensors 19 and 20 detect the passage of holes 21 of encoder 16 and provide signals A and B which are processed to provide pulses G representative of angular increments of rotation as explained previously. Pulses G are fed to the NAND gate 53 which also receives the signal from the inverter between the output put of up/down counter storage unit 51. Since no reverse rotation signals have been produced, the output of unit 51 is high and of the inverter is low. Thus, with the low input from the inverter, each pulse G applied to the NAND gate 53 causes a high output signal which fires the monostable multivibrator 54 which produces output signal J similarly representative of the predetermined increment of rotation. As previously explained signal J is fed to the ring counter 56. After a preset number of pulses have been counted in counter 56 it produces output signal R. During the initial tightening impacts, counter 56 is continually reset to zero by signal Q so that it cannot count the preset number of pulses and, of course, so that signal R cannot be provided. Referring particularly to FIG. 5, initial tightening produces a steady increase in the angle of forward rotation of encoder 16, as shown by curve J at 102, with no corresponding increase in either fastener preload or recoil time as indicated by curve L. As should also be clear from curve L, snug torque has not yet been applied to the fastener nor has the applied moment increased by more than the predetermined amount so that comparator 70 and peak value increase detector 64 have low output signals. Thus exclusive NOR gate 66 outputs signal Q. It should be noted that successive pulses shown in curve J each denote a 5° increase in forward rotation of encoder 16 in the particular oscillographic record shown here for illustrative purposes. Actually the amount of forward rotation between pulses can be set at any desired value depending on the degree of accuracy desired. When the fastener has been tightened sufficiently, causing it to contact a mating workpiece (not shown), a preload begins to build up in the fastener as shown by the preload curve at 104 in FIG. 5. The preload was obtained by well known external instrumentation means (not shown) for purposes of explaining this invention, but it should be understood that usually such instrumentation means is not utilized. At this point in the tightening cylce no measurable recoil of the hammer against the anvil in the wrench occurs. Upon further tightening, sufficient resistance to further rotation is encountered causing the hammer to recoil upon striking the anvil, as shown by curve L at 106. It should be understood that recoil time is dependent on the residual strain energy stored in the impact wrench driving shaft sockets and couplings, and this strain energy is dependent on the moment being applied, which moment varies with the instantaneous coefficient of friction as the fastener stops rotating. If signal L is equal to or exceeds some electrically equivalent predetermined snug torque value, which may be experimentally determined and set by adjusting the output from unit 72, signal P is fed to NOR gate 66 so that output signal Q which resets counter 56 to zero is discontinued and the counter starts counting forward angle rotation signals J. It has been determined that the selection of a snug torque value from unit 72 is not critical to the operation of the wrench. The criteria used in selecting a snug torque value is that it be set high enough to assure that preload is beginning to build up in the fastener, but that it not be set too high in the event that a maximum recoil value might occur before counter 56 is allowed to count forward rotation pulses J. In the present preferred embodiment, the snug torque value was set at the level of the first peak recoil value in storage unit 62 and in practice is an approximation of the torque required to build preload in the fastener.

Signal L representative of the peak recoil value at 106 is stored in the storage unit of peak value detector/storage unit 62 and the amplifier unit in unit 62 outputs to peak value increase detector unit 64 providing output pulse M which is fed to step generator 68 and NOR gate 66 causing signal Q to reset counter 56 to zero. Step generator 68 in FIG. 4 causes the previously highest recoil pulse L stored in unit 62 to be increased by a preset fixed or variable amount, thus building into the system successively higher recoil values than the previously highest stored value. For example, for the system shown by curve L of FIG. 5, an incremental fixed amount of about 100 mv is added for a peak value store of approximately 6 volts. This incremental value may be varied depending on the accuracy desired. The practical constraints on this incremental value are that it be small enough so that subsequent higher peak recoil values are detected, but that it be large enough so that subsequent peak recoil values just slightly greater than the previously stored highest peak recoil value do not continue to reset counter 56. It should also be understood that a fixed percentage of the previously stored highest peak recoil value could be added, such as two percent (2%), for example, with equally effective results. It can be seen from FIG. 5 that the initial peak recoil value of curve L at 106 causes curve N to increase to a first stored peak value at 108. The peak value at 108 of curve N is exceeded by the recoil 110, that is the applied moment exceeds the applied moment at 106 by the previously described predetermined fixed amount. As described signal M (see 114 curve M) is produced causing NOR gate 66 to discharge signal Q resetting counter 56 to zero and causing step generator 68 to increase the value of the signal L at 110 to be increased by the predetermined amount. This increased peak value is then stored in unit 62, as indicated by curve N at 112. Counter 56 then must begin counting forward rotation pulses J again. The next peak recoil value at 116 exceeds the previous peak value at 110 by the predetermined fixed amount and in the manner described causes peak value curve O to increase as shown at 118 and produce reset pulse 120 on curve M. Peak value 118 is stored in unit 62 until the next peak recoil value 122 of curve L occurs, which value exceeds previously highest peak recoil value 116 by the predetermined amount. A new peak value shown at 124 of curve N occurs and a reset pulse 126 on curve M is produced. Once again counter 56 is reset to zero and starts counting forward rotation pulses J. Subsequent recoil signals 128, 130, 132 and 134 do not exeed previously highest recoil value 122 by the predetermined amount, so that no higher peak value of curve N occurs after 124, nor does a reset pulse on curve M occur after 126. Counter 56 is then allowed to count successive forward rotation pulses 136, 138, 140, 142 and 144 of curve J without interruption. In the present preferred embodiment represented by FIG. 5, the preset number of pulses programmed into counter 56 is five (5), thus causing a stop signal 146 of curve R to be generated. Stop signal 146 is then fed into the control coil of solenoid value 76 to shut off the air supply to port 23 of the impact wrench. The number of angle pulses before shutoff of the wrench after the previously highest stored peak recoil value can be varied by adjusting the preset programmed value of counter 56. As shown by the fastener preload curve, no significant further preload is induced in the fastener beyond approximately the third angle pulse 140 after the previously highest stored peak recoil value 124. Thus the optimum shutoff point for the present preferred embodiment occurs between angle pulses 140 and 144 (i.e. 15–25 degrees of rotation after the last reset pulse 126), but the counter is set at five (5) pulses to insure that the fastener has reached the yield point.

Having thus described the structure and operation of a preferred embodiment of an impact wrench control system, some of the many advantages of the present invention should now be readily apparent. The control system provides a highly accurate and reliable means for tightening a joint to the yield point, that is, for providing maximum preload in a fastener tightened by an impact-type wrench, that is, a wrench wherein the tightening moment is applied periodically. Since the control system is adaptive, only minimal prior knowledge of the joint and fastener characteristics being tightened need be known in order to insure tightening to the maximum attainable preload of the fastener, namely the yield point. As previously stated, tightening to maximum preload at the yield point of the fastener material insures a joint of maximum efficiency with greatest resistance to loosening due to vibration and fatigue failure. The tightening cycle is very rapid, making the wrench ideally suitable for rapid assembly line use. In addition to tightening fastener to the yield point it should be understood that the method and apparatus according to this invention can be used to tighten fasteners to a similarly significant point, for example, preloads other than the yield point, by building into the fastener system a configuration causing the fastener to deform at a predetermined preload such that the applied torque levels out.

Obviously, many modifications and variations of the present invention are possible in light of the above teachings. It is therefore understood that within the scope of the appended claims, the invention may be practiced otherwise than as specifically described.

I claim:

1. In a rotary motion device, a bidirectional incremental encoding system for measuring maximum forward angular displacement of a bidirectionally rotatable rotating shaft comprising:
    an encoder operatively mounted on the shaft for rotation therewith including
        a plurality of indicia each at a fixed radius from center of the shaft, each indicium being spaced equidistantly from an adjacent indicium;
    first and second sensing means each juxtapositioned from said encoder opposite said indicia at a spaced circumferential interval for sensing the passage of said indicium and issuing respective output signals indicative thereof in phase quadrature relationship to each other; and
    direction determining means for receiving said first and second sensing means output signals and for producing respective forward and reverse angular rotation signals, said direction determining means further including bidirectional counting means for counting said forward angular rotation signals in a first direction and for counting said reverse angular rotation signals in a second direction, means for inhibiting said bidirectional counting means from counting said forward angular rotation signals when said counting means exhibits a predetermined count, said counting means counting said reverse angular rotation signals in said second direction from said predetermined count and counting said forward angular rotation signals in said first direction toward said predetermined count, gate means enabled when said bidirectional counting means exhibits said predetermined count to pass said forward angular rotation signals, and means for counting said forward angular rotation signals passed by said gate means.

2. An angular encoding system in accordance with claim 1 wherein the rotary motion device is an impact wrench.

3. An angular encoding system in accordance with claim 1 wherein said first and second sensing means are magnetic proximity sensors.

4. An angular encoding system in accordance with claim 1 wherein said first and second sensing means are located at a spaced interval of 180°.

5. An angular encoding system in accordance with claim 1 wherein said indicia are holes, and said encoder has eighteen holes each spaced 20° apart from an adjacent hole.

6. An angular encoding system in accordance with claim 1 wherein said output signals issued from said first and second sensing means alternate between relatively high and low levels; and said direction determining means comprises pulse generating means coupled to said first and second sensing means for generating edge transition pulses in response to the beginning and ending portions, respectively, of the output signals issued from said first and second sensing means, first gate means for passing a beginning edge transition pulse produced in response to said first sensing means output signal when said second sensing means output signal is at a predetermined one of its levels, second gate means for passing an ending edge transition pulse produced in response to said first sensing means output signal when said second sensing means output signal is at its other level, third gate means for passing a beginning edge transition pulse produced in response to said second sensing means output signal when said first sensing means output signal is at said other level, fourth gate means for passing an ending edge transition pulse produced in response to said second sensing means output signal when said first sensing means output signal is at said one level, fifth, sixth, seventh and eighth gate means operable complementary to said first, second, third and fourth gate means, respectively, forward signal generating means for generating said forward angular rotation signals in response to edge transition pulses passed by any of said first through fourth gate means, and reverse signal generating means for generating said reverse angular rotation signals in response to edge transition pulses passed by any of said fifth through eighth gate means.

7. In a rotary motion device, a bidirectional incremental encoding system for measuring maximum forward angular displacement of a bidirectionally rotatable rotating shaft comprising: an encoder operatively mounted on the shaft for rotation therewith including a plurality of indicia each at a fixed radius from center of the shaft, each indicium being spaced equidistantly from an adjacent indicium; first and second sensing means each juxtapositioned from said encoder opposite said indicia at a spaced circumferential interval for sensing the passage of said indicium and issuing respective output signals indicative thereof in phase quadrature relationship to each other; means for receiving said first and second sensing means output signals to produce respective forward and reverse angular rotation signals; counting means for counting said produced forward and reverse angular rotation signals to produce a count which is a function of the instantaneous angular displacement of said shaft; means for producing a signal representing the maximum forward angular displacement then obtained by said shaft; and control means responsive to said count for supplying to the last-mentioned means only those forward angular rotation signals which cause said signal representing the maximum forward angular displacement to increase.

8. The system of claim 7, wherein said control means comprises means for inhibiting said counting means from counting said forward angular rotation signals when said counting means exhibits a predetermined count; and gate means enabled when said counting means exhibits said predetermined count to pass said forward angular rotation signals to said means for producing a signal representing the maximum forward angular displacement then obtained by said shaft.

9. The system of claim 8 wherein said means for producing a signal representing the maximum forward angular displacement then obtained by said shaft comprises a unidirectional counter.

* * * * *